(12) United States Patent
Kammler et al.

(10) Patent No.: US 7,192,881 B2
(45) Date of Patent: Mar. 20, 2007

(54) METHOD OF FORMING SIDEWALL SPACER ELEMENTS FOR A CIRCUIT ELEMENT BY INCREASING AN ETCH SELECTIVITY

(75) Inventors: Thorsten Kammler, Ottendorf-Okrilla (DE); Karsten Wieczorek, Dresden (DE); Christoph Schwan, Gebhardshain (DE)

(73) Assignee: Advanced Micro Devices, Inc., Austin, TX (US)

( * ) Notice: Subject to any disclaimer, the term of this patent is extended or adjusted under 35 U.S.C. 154(b) by 208 days.

(21) Appl. No.: 10/987,466

(22) Filed: Nov. 12, 2004

(65) Prior Publication Data

US 2005/0118769 A1 Jun. 2, 2005

(30) Foreign Application Priority Data

Nov. 28, 2003 (DE) ................ 103 55 575

(51) Int. Cl.
*H01L 21/302* (2006.01)
*H01L 21/461* (2006.01)

(52) U.S. Cl. ............... 438/740; 438/230; 438/303

(58) Field of Classification Search ........ 438/184–185, 438/230, 303, 595, 740, 738, 743–744
See application file for complete search history.

(56) References Cited

U.S. PATENT DOCUMENTS

| 5,013,675 | A | | 5/1991 | Shen et al. ............... 437/44 |
| 5,847,428 | A | * | 12/1998 | Fulford et al. ............ 257/344 |
| 6,225,231 | B1 | | 5/2001 | Losavio ................... 438/705 |
| 6,448,167 | B1 | * | 9/2002 | Wang et al. .............. 438/595 |
| 6,498,067 | B1 | * | 12/2002 | Perng et al. .............. 438/305 |

\* cited by examiner

*Primary Examiner*—Thanhha S. Pham
(74) *Attorney, Agent, or Firm*—Williams, Morgan & Amerson, P.C.

(57) ABSTRACT

By heat treating a silicon dioxide liner prior to patterning a silicon nitride spacer layer, the etch selectivity of the silicon dioxide with respect to the silicon nitride is increased, thereby reducing or eliminating the problem of pitting through the silicon dioxide layer. This allows further scaling of the devices, wherein an extremely thin silicon dioxide liner is required to obtain an accurate lateral patterning of the dopant profile in the drain and source regions.

15 Claims, 4 Drawing Sheets

METHOD OF FORMING SIDEWALL SPACER ELEMENTS FOR A CIRCUIT ELEMENT BY INCREASING AN ETCH SELECTIVITY

BACKGROUND OF THE INVENTION

1. Field of the Invention

Generally, the present invention relates to the fabrication of integrated circuits, and, more particularly, to the formation of sidewall spacer elements used to, for instance, laterally pattern a dopant profile implanted adjacent to a circuit element having formed thereon the sidewall spacer elements.

2. Description of the Related Art

The fabrication of integrated circuits requires a large number of process steps involving photolithography, etch techniques, implantation sequences, anneal cycles and the like. In MOS technology, one important step is the formation of a gate electrode of a field effect transistor, wherein the size of the gate electrode significantly affects the overall performance of the MOS transistor element. The gate electrode is a line-like circuit element formed above a crystalline semiconductor region, typically a silicon region, wherein a thin gate insulation layer is disposed between the semiconductor region and the gate electrode so as to provide a dielectric barrier and generate a capacitive coupling to the underlying semiconductor region that forms a conductive channel upon application of an appropriate control voltage to the gate electrode. The channel forms in the semiconductor region in the vicinity of the gate insulation layer and establishes an electrical connection between highly doped source and drain regions. The distance between the drain and source regions, i.e., the lateral extension of the channel, which is correlated with the lateral extension of the gate electrode, also referred to as channel length, is an important design parameter and has now reached 0.1 µm and less in sophisticated integrated circuits.

In standard MOS technology, the gate electrode is formed prior to the formation of the drain and source regions by ion implantation. During the ion implantation process, the gate electrode acts as an implantation mask, thereby ensuring a correct alignment of the drain and source regions with respect to the gate electrode. Since a plurality of high temperature treatments will be performed after the formation of the gate electrode, the gate insulation layer formed prior to the patterning of the gate electrode is preferably manufactured on the basis of silicon dioxide or silicon nitride, and the gate electrode is made of polysilicon to obtain a gate electrode structure exhibiting a high thermal stability. After the patterning of the gate electrode, the drain and source regions are formed by ion implantation while using the gate electrode as an implantation mask. It turns out, however, that transistor elements of reduced feature sizes require sophisticated dopant profiles in the lateral direction and also in the vertical direction, wherein the term "vertical" describes the direction perpendicular to the surface of the substrate while the term "lateral" roughly corresponds to the flow direction of charge carriers in the channel. While the vertical dopant profiling may be achieved by correspondingly adjusting the implantation parameters, such as dose and energy for a given ion species, the lateral dopant profiling requires an enhanced masking technique, which is typically accomplished with the formation of one or more sidewall spacer elements.

Figure 1A:
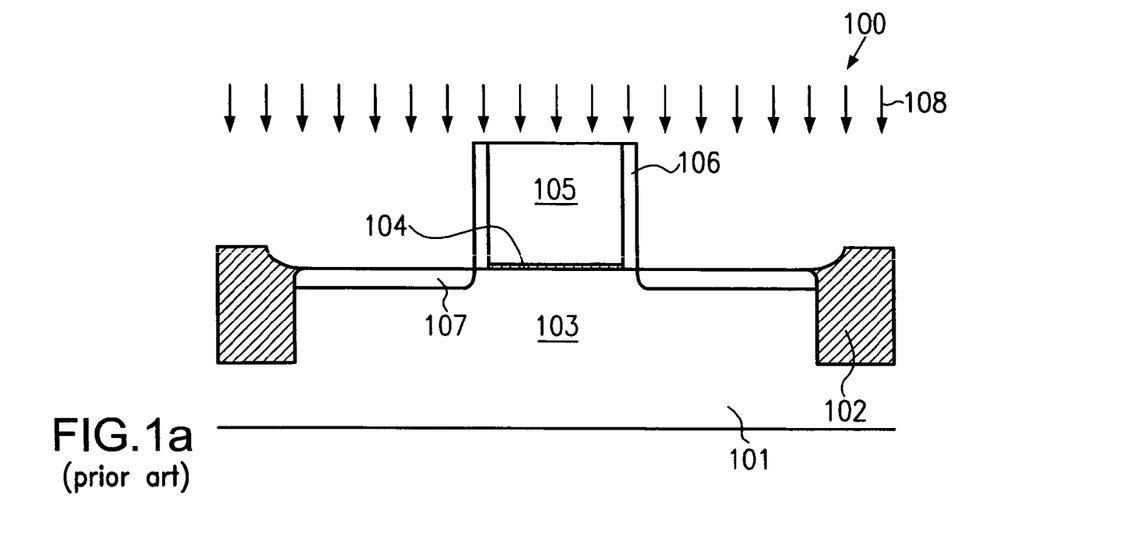
FIGS. 1a–1d schematically show a transistor element during various manufacturing stages in accordance with a typical conventional process flow.
Figure 1B:
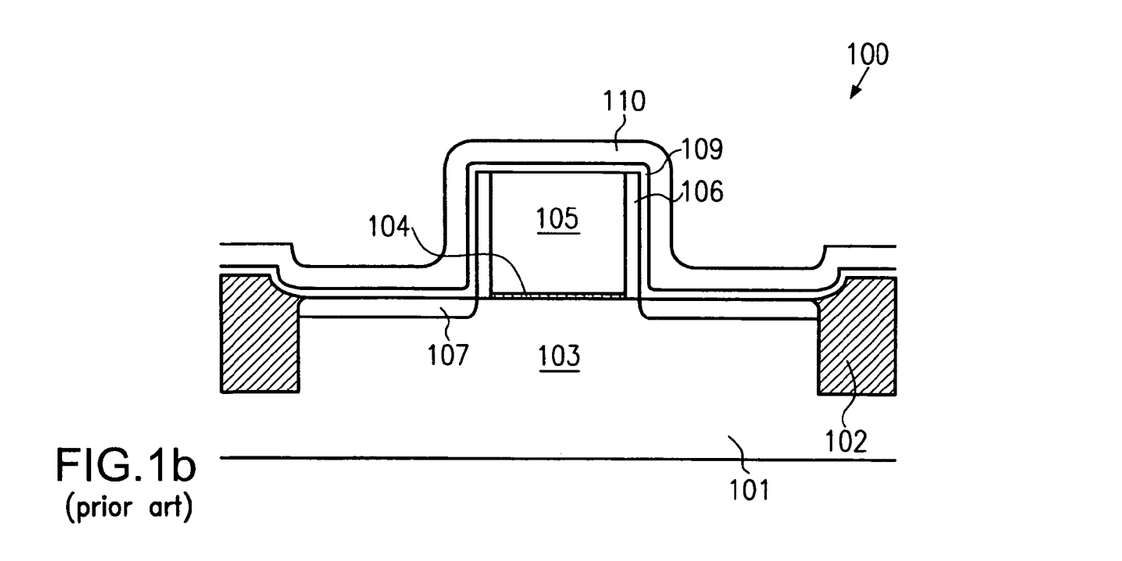
Figure 1C:
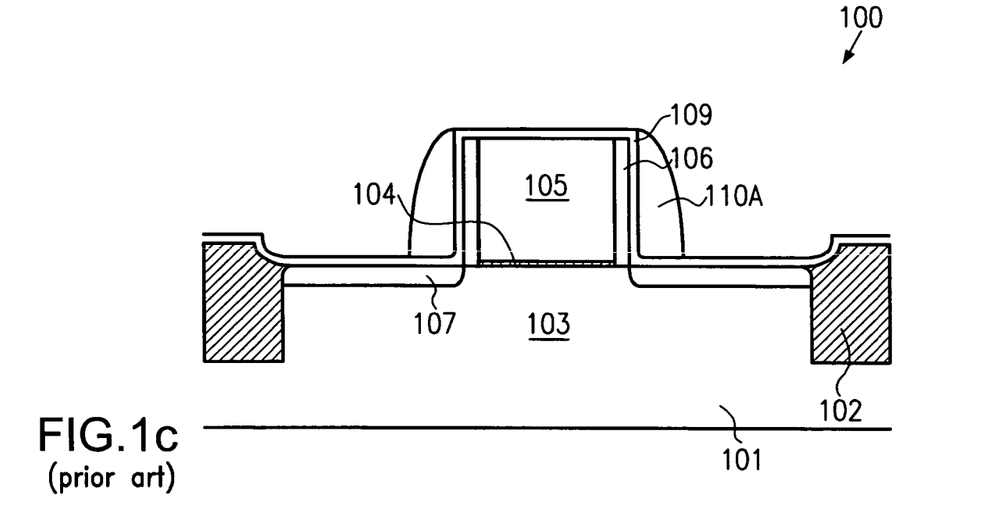

With reference to FIGS. 1a–1c, a typical conventional process for forming sidewall spacer elements will now be described in more detail so as to discuss certain inefficiencies of the conventional technology when feature sizes of circuit elements are further scaled down. FIG. 1a is a schematic cross-sectional view of a transistor element 100 at an early manufacturing stage. The transistor element 100 comprises a substrate 101, which may be a silicon substrate or a silicon-on-insulator (SOI) substrate in sophisticated devices. Irrespective of the type of substrate used, the substrate 101 comprises a substantially crystalline semiconductor region 103 which is enclosed by an isolation structure 102, which is typically provided in modern integrated circuits in the form of a trench isolation. The transistor element 100 further includes a gate electrode 105 comprised of polysilicon and formed above the silicon region 103 and separated therefrom by a gate insulation layer 104. In principle, the reduction of the gate length, i.e., in FIG. 1a, the horizontal extension of the gate electrode 105, requires a corresponding reduction of a thickness of the gate insulation layer 104 to ensure appropriate capacitive coupling for proper control of a channel forming below the gate insulation layer 104 upon application of an appropriate control voltage. For a gate length of approximately 100 nm, the thickness of the gate insulation layer 104, when comprised of silicon dioxide, is in the range from about 2–4 nm. In view of proper channel controllability and in order to maintain the integrity of the gate insulation layer 104, highly sophisticated implantation profiles are required adjacent to the gate electrode 105. To this end, a sidewall spacer element 106, frequently referred to as an offset spacer, is formed on the sidewalls of the gate electrode 105 to act in combination with the gate electrode 105 as an implantation mask during a first implantation, indicated by 108. The corresponding dopant profile, indicated by 107, will also be referred to as an extension region.

A typical process flow for forming the transistor element 100 as shown in FIG. 1a may comprise the following processes. First, the trench isolations 102 are formed in the substrate 101 by sophisticated photolithography, anisotropic etch and deposition techniques, as are well established in the art. Thereafter, a plurality of implantation cycles may be performed to establish a required vertical dopant profile (not shown) within the semiconductor region 103. Thereafter, a material layer for the gate insulation layer 104 is formed on the substrate 101, for instance by sophisticated oxidation and/or deposition techniques. Next, a layer of polysilicon is deposited with a required thickness by, for instance, low pressure chemical vapor deposition (LPCVD) on the basis of process parameters as are well established in the art. Subsequently, the polysilicon layer and the material layer for the gate insulation layer 104 are patterned by sophisticated photolithography and anisotropic etch techniques, wherein, typically, a resist feature is formed first and is trimmed to specified dimensions to act as an etch mask during the subsequent anisotropic etch process, during which the gate electrode 105 is formed from the polysilicon layer, while the material layer for the gate insulation layer 104 serves as an etch stop layer. Thereafter, the residuals of the material layer forming the gate insulation layer 104 may be removed and the substrate 101 may be oxidized (not shown) to form a thin silicon dioxide layer on exposed surfaces of the silicon region 103 and the gate electrode 105. Next, a silicon dioxide layer may be conformally deposited and then anisotropically etched selectively to silicon to form the offset spacers 106. Thereby, the width of the offset spacer 106 and, thus, the lateral blocking effect thereof, is determined by the thickness of the deposited silicon dioxide layer. Finally, using the gate electrode 105 and the offset spacers 106 as an implantation mask, the implantation 108 is performed to define the extension regions 107, the dopant profile of which is determined in the vertical direction by the type of dopants used and the corresponding implantation energy, and in the lateral direction by the offset spacers 106.

FIG. 1*b* schematically shows the transistor element 100 in an advanced manufacturing stage. A spacer layer 110, for instance comprised of silicon nitride, is conformally formed above the substrate 101 and the gate electrode 105 with a thickness as required for further profiling of the lateral dopant concentration in the semiconductor region 103. Moreover, a thin etch stop layer 109, comprised of silicon dioxide, is disposed between the spacer layer 110 and the substrate 101. A typical process includes the deposition of the etch stop layer 109 by plasma enhanced chemical vapor deposition followed by plasma enhanced chemical vapor deposition of the spacer layer 110. Since the lateral dopant profiling depends on the accuracy of the deposition of the spacer layer 110, silicon nitride is the preferred candidate as this material may be deposited by well-established CVD techniques more precisely compared to, for instance, silicon dioxide. After the deposition of the layers 109 and 110, an anisotropic etch process is performed with an appropriately selected etch chemistry exhibiting a moderately high etch selectivity between the etch stop layer 109 and the spacer layer 110. Owing to the ever decreasing feature sizes, the thickness of the spacer layer 110 and also of the etch stop layer 109, have to correspondingly be adapted to the reduced feature sizes so that a thickness of the etch stop layer 109 is typically in the range of 1–5 nm.

FIG. 1*c* schematically shows the transistor element 100 after the anisotropic etch process, wherein the spacer layer 110 is substantially removed except for portions at the sidewall of the gate electrode 105, which are also denoted as sidewall spacers 110*a*. While for increased feature sizes and thus increased thicknesses of the layers 109 and 110, typically the thickness of the thin etch stop layer 109 is sufficient to reliably stop the etch front when substantially completely removing the excess material of the spacer layer 110 from horizontal surface portions, since the etch stop layer 109 only has to slow down the etch process at the exposed portions until all of the spacer layer 110 material is removed across the entire substrate 101, the situation is different for extremely scaled devices. In this case, the deposited etch stop layer 109, e.g., silicon dioxide, may, owing to the reduced thickness, provide local "channels" through which the etch chemistry may attack the surface portion of the region 103 and the gate electrode 105, thereby generating a "pitting" effect.

As previously explained, the gate electrode 105, although highly doped, exhibits a relatively low conductivity compared to, for instance, metals such as aluminum, tungsten and the like as are typically used in semiconductor fabrication. Consequently, in a typical MOS technology, the conductivity of the gate electrode 105 is increased by forming a metal silicide region on the gate electrode 105 to reduce the resistivity thereof. During the silicidation process, the sidewall spacer 110*a* additionally serves the purpose of allowing a self-aligned formation of metal silicide in the drain and source regions to be formed and in the gate electrode 105, since a silicide formation on the sidewall spacer 110*a* is substantially prevented. As the amount of metal silicide formed in the gate electrode 105 in the subsequent process may, depending on the process specifics, be determined based on the size of exposed silicon area of the gate electrode 105, in some process flows, the anisotropic etch process is continued to further reduce the vertical extension of the spacer element 110*a* while substantially maintaining the lateral width thereof. During the continuation of the anisotropic etch process, exposed portions of the etch stop layer 109 are increasingly consumed due to the limited etch selectivity, thereby still further increasing the pitting effect and severely jeopardizing the integrity of the underlying material surfaces.

Figure 1D:
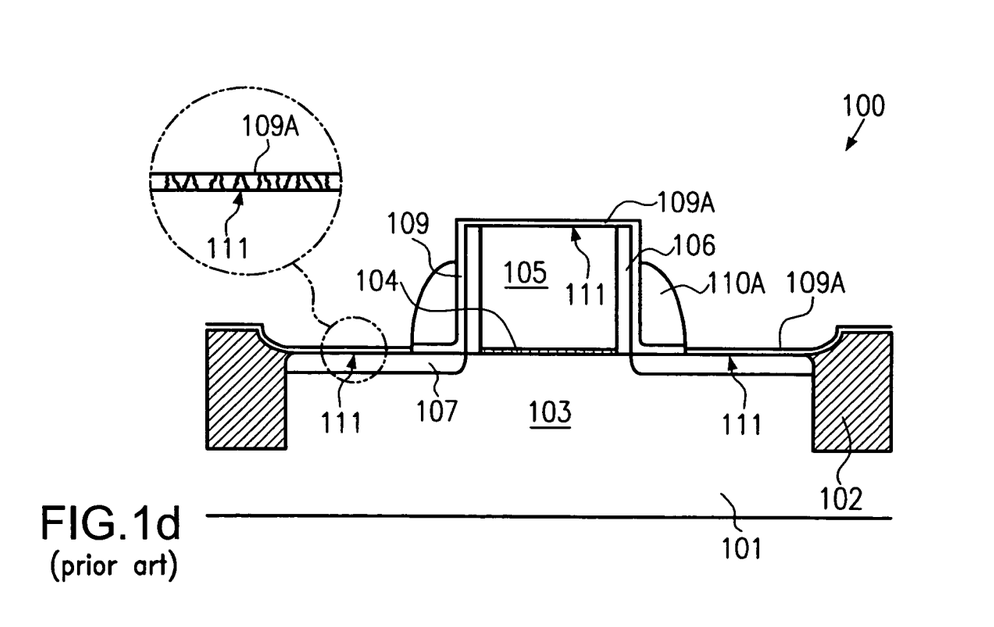

FIG. 1*d* schematically shows the transistor element 100 after completion of the above-described anisotropic etch process. The sidewall spacers 110*a* exhibit a significantly reduced vertical extension to expose upper sidewall portions of the gate electrode 105, which are still covered by residuals of the etch stop layer 109 and the offset spacers 106, which will be removed in a subsequent isotropic wet chemical etch process on the basis of, for instance, hydrogen fluoride. Moreover, exposed portions of the etch stop layer 109, indicated as 109*a*, show a significantly reduced thickness and may result in pitting, indicated as 111, of the underlying material. The locally inhomogeneous damage, i.e., the pitting 111, is disadvantageous for the further processing of the transistor element 100, as, for instance, the mechanical and electrical characteristics of the surface portions involved are significantly degraded. In extremely scaled transistor elements, the available surface area for forming contacts is also extremely reduced, and undue transistor performance deterioration may be observed that is caused by surface portions damaged by pittings 111 during the spacer etch sequence. Moreover, the problem is exacerbated in sophisticated transistor elements where more than two spacer elements, such as the offset spacer 106 and the spacer 110*a*, have to be formed in order to assure the required lateral profiling in the semiconductor region 103. Hence, in a subsequent patterning process for further sidewall spacers, which may also be anisotropically etched until upper sidewall portions of the gate electrode 105 are exposed, a further degradation of exposed surface portions by, for example, pitting is obtained. Reducing the effect of pitting during the anisotropic etching by, for instance, increasing the thickness of the etch stop layer 109, is less than desirable, since the subsequent isotropic removal of residues of the layer 109 and the offset spacers 106 would then result in a non-tolerable under-etch of the sidewall spacer 110*a*. Moreover, increasing the thickness of the layer 109 at the expense of reducing the thickness of the spacer layer 110 may result in reduced controllability of the lateral dopant profiling.

In view of the above-identified problems, there exists a need for an improved technique for forming sidewall spacer elements, thereby reducing the damage caused in exposed surface portions during the anisotropic patterning of a spacer layer.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that provides increased etch selectivity of a silicon dioxide liner with respect to a spacer layer, typically comprised of silicon nitride, to reduce the probability of pitting through the silicon dioxide liner during a subsequent anisotropic etch process for patterning the spacer layer. The resistance of the silicon dioxide liner, with respect to the etch chemistry used for patterning the sidewall spacer elements, may be increased by densifying the structure of the silicon dioxide liner, which is typically deposited by plasma enhanced chemical vapor deposition.

Hence, according to one illustrative embodiment of the present invention, a method comprises depositing a silicon dioxide layer over a substrate comprising a line feature and heat treating the substrate to density the silicon dioxide layer. Thereafter, a spacer layer is formed over the silicon dioxide layer and the spacer layer is etched while the densified silicon dioxide layer is used as an etch stop layer to form sidewall spacers adjacent to the line feature.

According to still another illustrative embodiment of the present invention, a method comprises depositing a silicon dioxide layer over a substrate comprising a line feature. A spacer layer is formed over the silicon dioxide layer. Then, the substrate is heat treated to densify the silicon dioxide layer and the spacer layer is etched, wherein the densified silicon dioxide layer is used as an etch stop layer, thereby forming sidewall spacers adjacent to the line feature.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is generally based on the concept that the structure of a CVD deposited silicon dioxide may be densified by a heat treatment. It is generally known that a deposited silicon dioxide typically has strained bonds and a reduced density compared to an oxide obtained by oxidation, thereby providing a reduced resistance to the diffusion of atoms and molecules, such as water molecules and, in particular, the components of an etch chemistry used to pattern a sidewall spacer. Owing to the reduced density, therefore, the interaction of an etch chemistry with the silicon dioxide layer may lead, in addition to a material removal of the silicon dioxide, to a locally limited attack of the underlying material by diffusing etch components, thereby resulting in pitting of the underlying material surface. By heat treating the deposited silicon dioxide, the structure thereof may be densified, thereby significantly increasing the resistance against diffusing etch components.

Figure 2A:
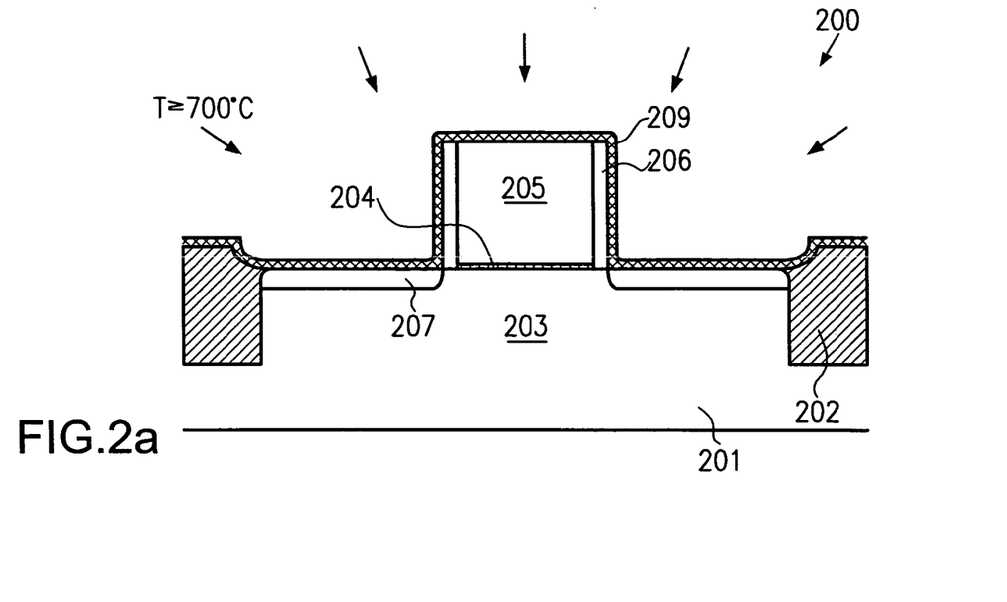
FIGS. 2a–2d schematically show cross-sectional views of a line feature, such as a gate electrode, during different manufacturing stages in forming sidewall spacer elements with the aid of a densified silicon dioxide layer.

With reference to FIGS. 2a–2d, further illustrative embodiments of the present invention will now be described in more detail. In FIG. 2a, a semiconductor device 200 comprises a substrate 201, which may represent an appropriate substrate suitable for forming thereon and therein integrated circuits. In particular, the substrate 201 may represent a silicon substrate or a silicon-on-insulator (SOI) substrate, having formed thereon a substantially crystalline silicon region. In other cases, the substrate 201 may have formed thereon any other appropriate semiconductor layer, such as a germanium-containing semiconductor layer or any other II/VI or III/V semiconductor compounds. Since silicon dioxide may also advantageously be used in the fabrication of semiconductor devices having crystalline regions other than being comprised of silicon, the present invention should not be considered as being restricted to silicon devices unless such limitations are explicitly set forth in the appended claims.

The substrate 201 comprises an isolation structure 202 enclosing a crystalline region 203 of an appropriate type above which is formed a line feature 205, which in the present example is representative of a gate electrode of a field effect transistor. It should be appreciated, however, that the line feature 205 may represent any other circuit element, such as polysilicon lines used to interconnect individual circuit elements or different chip areas of an integrated circuit. In the case of representing a gate electrode, the line feature 205 may be separated from the crystalline region 203 by a gate insulation layer 204. The gate insulation layer 204 may be comprised of silicon dioxide, silicon oxynitride, silicon nitride, or any high-K dielectric material or a combination of the preceding materials, depending on design requirements. The present invention is particularly advantageous in combination with highly sophisticated transistor elements having critical dimensions, i.e., in the device 200 as shown in FIG. 2a, the horizontal dimension of the line feature 205, on the order of 100 nm and significantly less. As previously explained with reference to FIGS. 1a–1d, sidewall spacers may be employed with such devices to create precise lateral dopant profiles, wherein the spacer layers and the associated etch stop layers have to be reduced in thickness. It should be born in mind, however, that the present invention may also be applied to the device 200 having a critical dimension greater than specified above, thereby providing enhanced product yield. An offset spacer 206 may be formed on the sidewalls of the line feature 205, wherein a width of the offset spacer 206 is selected in accordance with process requirements to assure the required lateral dopant profile of extension regions 207 formed in the crystalline region 203. A silicon dioxide layer 209 is conformally formed on the substrate 201 and the line feature 205 including the offset spacers 206. In sophisticated applications, a thickness of the silicon dioxide layer 209 may range from approximately 1–10 nm. In other embodiments, a greater thickness may be considered appropriate.

A typical process flow for forming the semiconductor device 200, as shown in FIG. 2a, may comprise the following processes. The isolation structure 202, the line feature 205, the gate insulation layer 204 and the offset spacers 206 may be formed in accordance with substantially the same process steps as are described with reference to FIG. 1a. It may be readily appreciated that various modifications regarding individual process steps and materials may be performed depending on design and process requirements for a specified product. For instance, the isolation structures 202 may be provided in the form of locally oxidized portions or in any other appropriate form. Furthermore, the process sequence and process recipes for forming the isolation structure 202 in the form of trench isolations may depend on the type of material used as the crystalline region 203. Then, the silicon dioxide layer 209 is deposited, typically by plasma enhanced chemical vapor deposition from TEOS or silane, wherein typically deposition on the basis of TEOS and ozone is preferable in view of conformality of the obtained layer. As previously discussed, a deposited silicon dioxide layer exhibits an inferior density compared to a silicon dioxide layer formed by oxidation and, hence, provides less resistance to the diffusion of etch components, thereby resulting in a reduced etch selectivity with respect to a specified etch chemistry used in a subsequent patterning of a spacer layer. Thus, according to the present invention, the substrate 201 is heat treated after the deposition of the silicon dioxide layer 209 at temperatures in the range of approximately 700° C. and higher so as to reconfigure the near order structural composition of the silicon dioxide. In one embodiment, the substrate 201 is heat treated at a temperature of approximately 730° C. and higher for a time interval of approximately 60–300 seconds.

In another embodiment, the dopants defining the extension regions 207 are activated after the deposition of the silicon dioxide layer 209 at a temperature of approximately 800–1000° C. for approximately 5–50 seconds. During the activation of the dopants in the extension regions 207, the silicon dioxide layer 209 is also densified, thereby providing the required structural reconfiguration for the subsequent etch process. In other embodiments, the anneal process for activating the dopants of the extension regions 207 may be controlled to obtain a required degree of densification of the silicon dioxide layer 109, when the time interval for activating the dopants at the above-specified elevated temperature is considered insufficient for the required densification. To this end, the anneal temperature may be lowered to approximately 700° C. after activating the dopants, and may be maintained until a required degree of densification is achieved. Since at least one further implantation step and a corresponding anneal cycle is required, when the device 200 is to represent a field effect transistor, the additional diffusion of the dopants of the extension regions 207 may be taken into consideration by, for instance, appropriately selecting the width of the offset spacer 206. That is, contrary to a single anneal cycle for activating the dopants in the extension regions 207 during a subsequent anneal cycle and of dopants still to be implanted into the crystalline regions 203, an additional anneal cycle may result in an increased diffusion activity of the dopants in the extension regions 207, since this additional diffusion activity may produce a reduced channel length owing to the additional lateral migration of the dopants. This reduction of the channel length may be compensated for by correspondingly increasing the width of the offset spacers 206 and also by increasing the dose of the implantation to obtain substantially the same dopant concentration at the PN-junction, i.e., the interface between the regions 203 and 207, compared to a reduced offset spacer width and a single anneal cycle.

After the heat treatment of the substrate 201, that is, after the densification of the silicon dioxide layer 209, a spacer layer 210 may conformally be deposited on the silicon dioxide layer 209.

Figure 2B:
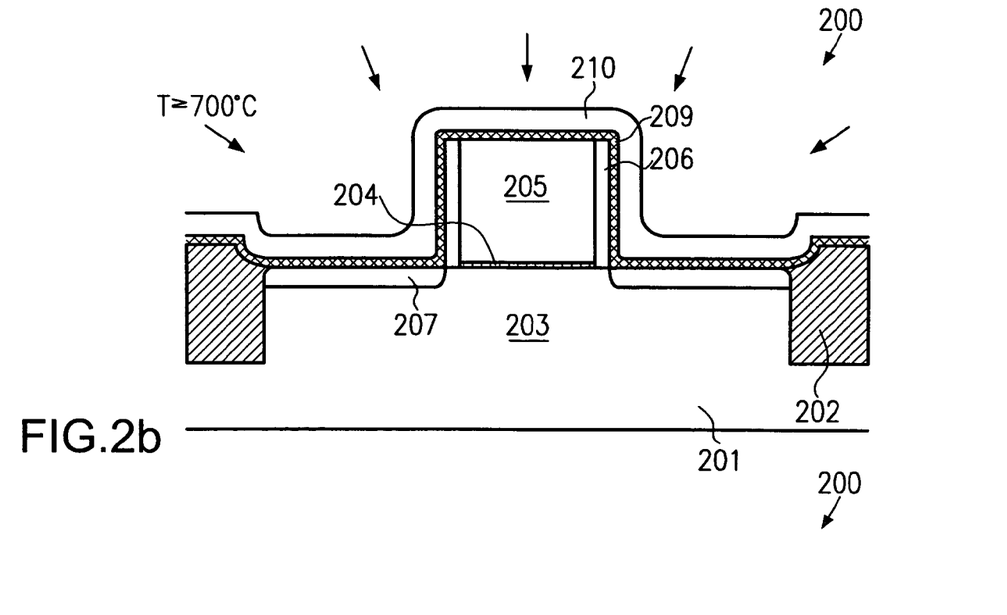

FIG. 2b schematically shows the semiconductor device 200 after the formation of the spacer layer 210. In a particular embodiment, the spacer layer 210 is comprised of silicon nitride. The spacer layer 210 may be deposited by well-established plasma enhanced chemical vapor deposition, for which well established process recipes are well known in the art.

In another illustrative embodiment, starting from the device 200 as shown in FIG. 2a, the silicon dioxide layer 209 is deposited followed by the deposition of the spacer layer 210 as in the conventional approach. Contrary to the conventional technique, however, the heat treatment is then performed so as to densify the silicon dioxide layer 209. In one embodiment, the densification of the layer 209 may be performed immediately prior to or during the deposition of the spacer layer 210. For instance, the spacer layer 210 may be deposited by thermal CVD, requiring elevated temperatures compared to the plasma enhanced deposition of the spacer layer 210. Heating the substrate 201 to the required temperature may then be advantageously used to also accomplish the desired densification of the silicon dioxide layer 209.

In a further embodiment, the silicon dioxide layer 209 may be deposited and may be densified by a corresponding heat treatment. Thereafter, when the heat treatment for densifying the layer 209 is considered inappropriate with respect to a thermal budget for the formation of the semiconductor device 200, the extension regions 207 may be formed by implanting a specified dopant species through the densified silicon dioxide layer 109, thereby eliminating the effect of the heat treatment for densifying the layer 109 on the dopants in the region 207.

Again referring to FIG. 2b, the spacer layer 210 is then anisotropically patterned with an etch chemistry that is selective to the densified silicon dioxide layer 209, wherein the selectivity is significantly increased due to the heat treatment of the densified layer 209. Hence, during the exposure of the silicon dioxide layer 209 to the etch chemistry, the probability for pitting through the densified layer 209 is significantly reduced, thereby increasing manufacturability and product yield.

Figure 2C:
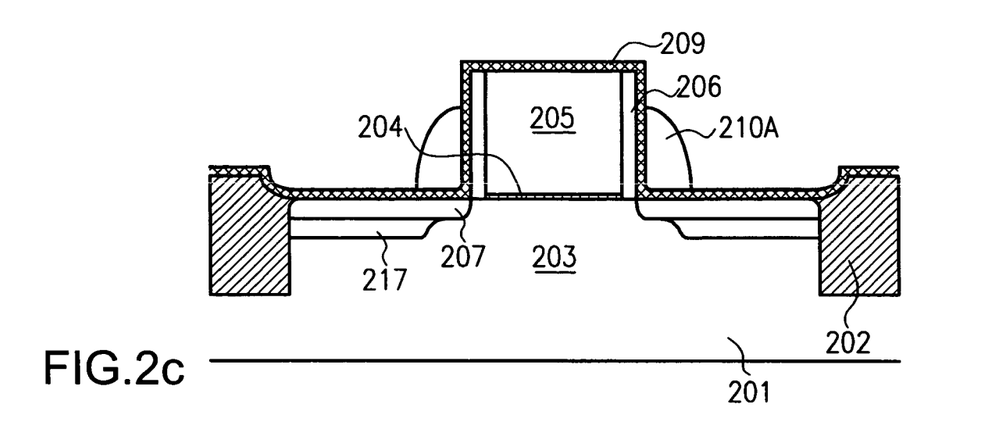

FIG. 2c schematically shows the semiconductor device 200 after the completion of the anisotropic etch process for patterning the spacer layer 210, thereby forming the sidewall spacer 210a. In the embodiment shown in FIG. 2c, the vertical size of the spacer elements 210a is reduced so as to expose upper sidewall portions of the line feature 205, wherein these portions are still covered by the offset spacer 206 and the silicon dioxide layer 209. Due to the increased selectivity of the densified silicon dioxide layer 209 with respect to the etch chemistry in forming the spacers 210a, the probability for pitting through the layer 209 is reduced, even if the anisotropic etch process is continued until a reduced spacer height is obtained. In other embodiments, the spacers 210a may not be reduced in height, wherein the increased etch selectivity of the densified silicon dioxide layer 209 may improve product yields compared to the conventional process flow. Moreover, source and drain regions 217 are formed in the crystalline region 203, wherein, in the corresponding implantation process, the spacers 210a act as an implantation mask.

The process steps employed to fabricate the semiconductor device 200, as shown in FIG. 2c, may substantially comprise the same processes as previously described with reference to FIGS. 1c and 1d. Moreover, after the implantation for forming the source and drain regions 217, a corresponding anneal cycle may be performed to activate the dopants and to cure, at least to a certain degree, lattice damage created during the implantation. The exposed portions of the densified silicon dioxide layer 209 and of the offset spacers 206 may be removed prior to or after the implantation for forming the drain and source regions 217.

As previously discussed, the lateral dopant profile within the crystalline region 203 may require the formation of three or more sidewall spacer elements. To this end, a further silicon dioxide layer may be deposited and the sequence described with reference to FIGS. 2a and 2b may be repeated to create a further sidewall spacer element, wherein the increased selectivity of the corresponding densified silicon dioxide layer also provides a significantly reduced probability for pitting through the layer during the patterning process.

After the finally desired dopant profile is created within the crystalline region 203, metal silicide portions may be formed in the extension regions 207 and the line feature 205, wherein the increased exposed surface portion of the line feature 205 provides an increased amount of metal silicide formed therein.

Figure 2D:
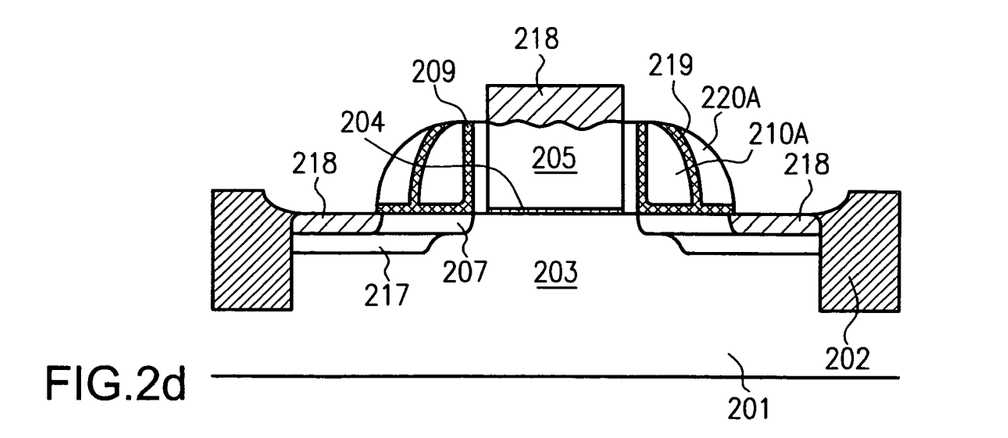

FIG. 2d schematically depicts the semiconductor device 200 after completion of the above-described sequence with an additional spacer element 220A formed on a densified silicon dioxide layer 219. Metal silicide regions 218 are formed in the line feature 205 and the drains and source regions 217 including the extension regions 207. Thus, the semiconductor device 200 represents a field effect transistor with enhanced lateral dopant profile, wherein the densified silicon dioxide layers 209 and 219, if provided, significantly reduce any pitting which in the conventional technique may result in reduced production yields and/or may even prevent the usage of thin silicon dioxide layers during the spacer formation.

As a result, the present invention provides a technique that enables the formation of sidewall spacer elements, for instance comprised of silicon nitride, more reliably compared to the conventional process flow in that a silicon dioxide layer, acting as an etch stop layer, is heat treated to increase the density thereof. The increased density results in a reduced probability for the occurrence of pitting effects or even in a complete elimination of pitting through of the silicon dioxide layer during the anisotropic etch process.

Thus, an increased manufacturability and production yield is obtained, even for extremely scaled semiconductor devices requiring a very thin silicon dioxide layer as the etch stop layer during the anisotropic patterning of the spacer elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
depositing a first silicon dioxide layer over a substrate comprising a line feature;
heat treating said substrate to densify said first silicon dioxide layer;
forming a first spacer layer over said densified first silicon dioxide layer;
anisotropically etching said first spacer layer while using said densified first silicon dioxide layer as an etch stop layer to form first sidewall spacers adjacent to said line feature, during said anisotropically etching said first spacer layer, an upper sidewall portion of said line feature being exposed through said first sidewall spacers; and
depositing a second silicon dioxide layer over said substrate, heat treating said substrate to density said second silicon dioxide layer, depositing a second spacer layer over said second silicon dioxide layer, and forming a second sidewall spacer adjacent to said first sidewall spacer by anisotropically etching said second spacer layer to expose said upper sidewall portion of said line feature.

2. The method of claim 1, wherein said first spacer layer comprises silicon nitride.

3. The method of claim 1, wherein heat treating said substrate is performed at a temperature of approximately 700° C. and more.

4. The method of claim 1, further comprising implanting a dopant into said substrate while using said first sidewall spacer as an implantation mask.

5. The method of claim 1, further comprising implanting a dopant into said substrate while using said sidewall spacer and said second sidewall spacer as an implantation mask.

6. The method of claim 1, wherein a thickness of said first silicon dioxide layer is in the range of approximately 1–10 nm.

7. The method of claim 1, further comprising implanting a dopant species into said substrate, wherein heat treating said substrate includes activating said dopant species and densifying said first silicon dioxide layer.

8. The method of claim 1, further comprising implanting a dopant species into said substrate adjacent to said line feature prior to heat treating said substrate to densify said first silicon dioxide layer.

9. A method, comprising:
depositing a first silicon dioxide layer over a substrate comprising a line feature;
forming a first spacer layer over said first silicon dioxide layer;

heat treating said substrate to densify said first silicon dioxide layer;

anisotropically etching said first spacer layer while using said densified first silicon dioxide layer as an etch stop layer to form first sidewall spacers adjacent to said line feature, during said anisotropically etching said first spacer layer, an upper sidewall portion of said line feature being exposed through said first sidewall spacers; and depositing a second silicon dioxide layer over said substrate, heat treating said substrate to density said second silicon dioxide layer, depositing a second spacer layer over said second silicon dioxide layer, and forming a second sidewall spacer adjacent to said first sidewall spacer by anisotropically etching said second spacer layer to expose said upper sidewall portion of said line feature.

10. The method of claim 9, wherein said first spacer layer comprises silicon nitride.

11. The method of claim 9, wherein heat treating said substrate is performed at a temperature of approximately 700° C. and more.

12. The method of claim 9, further comprising implanting a dopant into said substrate while using said first sidewall spacer as an implantation mask.

13. The method of claim 9, further comprising implanting a dopant into said substrate while using said first sidewall spacer and said second sidewall spacer as an implantation mask.

14. The method of claim 9, wherein a thickness of said first silicon dioxide layer is in the range of approximately 1–10 nm.

15. The method of claim 9, further comprising implanting a dopant species into said substrate adjacent to said line feature prior to heat treating said substrate to densify said first silicon dioxide layer.

* * * * *